(12) United States Patent
Ha et al.

(10) Patent No.: US 8,009,504 B2
(45) Date of Patent: Aug. 30, 2011

(54) SEMICONDUCTOR MEMORY INPUT/OUTPUT DEVICE

(75) Inventors: Sung-Joo Ha, Gyeonggi-do (KR); Ho-Youb Cho, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 391 days.

(21) Appl. No.: 12/339,389

(22) Filed: Dec. 19, 2008

(65) Prior Publication Data
US 2009/0161447 A1 Jun. 25, 2009

(30) Foreign Application Priority Data
Dec. 20, 2007 (KR) ........................ 10-2007-0134661

(51) Int. Cl.
*G11C 8/00* (2006.01)
(52) U.S. Cl. .............................. 365/230.06; 365/230.08
(58) Field of Classification Search ............. 365/230.06, 365/230.08, 233.19
See application file for complete search history.

(56) References Cited

U.S. PATENT DOCUMENTS

| 6,246,626 B1 * | 6/2001 | Roohparvar | 365/226 |
| 2002/0012285 A1 * | 1/2002 | Noda et al. | 365/233 |
| 2008/0192558 A1 * | 8/2008 | Yoshida et al. | 365/225.7 |

FOREIGN PATENT DOCUMENTS

| KR | 1020050058872 | 6/2005 |
| KR | 1020060002479 | 1/2006 |

OTHER PUBLICATIONS

Notice of Allowance issued from Korean Intellectual Property Office on Mar. 30, 2011.

* cited by examiner

*Primary Examiner* — Vu A Le
(74) *Attorney, Agent, or Firm* — IP & T Group LLP

(57) ABSTRACT

A semiconductor memory input/output device includes selection pads used to input and output signals for multiple operation modes and having multiple functions, a control signal generator for outputting setting signals and a mask control signal, a lower input/output unit including a lower output buffer for outputting a read data strobe signal to a selection pad and a lower input buffer for receiving a lower data mask signal from the selection pad, and selecting one operation of the lower output buffer and the lower input buffer, and an upper input/output unit including an upper output buffer for outputting an inverted read data strobe signal to the second selection pad and an upper input buffer for receiving an upper data mask signal from the second selection pad, and selecting one operation of the upper output buffer and the upper input buffer.

13 Claims, 4 Drawing Sheets

FIG. 3

| A11<br>(RDQS Enable) | A10<br>(RDQSb Enable) | Strobe Function Matrix | | | |
|---|---|---|---|---|---|
| | | RDQS/DM | RDQSb | DQS | DQSb |
| 0(Disable) | 0(Enable) | DM | RDQSb | DQS | DQSb |
| 0(Disable) | 1(Disable) | DM | Hi-Z | DQS | DQS |
| 1(Enable) | 0(Enable) | RDQS | Hi-Z | DQS | Hi-Z |
| 1(Enable) | 0(Enable) | RDQS | RDQSb | DQS | RDQSb |
| 1(Enable) | 1(Disable) | RDQS | Hi-Z | DQS | Hi-Z |

SEMICONDUCTOR MEMORY INPUT/OUTPUT DEVICE

CROSS-REFERENCE TO RELATED APPLICATION

The present invention claims priority of Korean patent application number 10-2007-0134661, filed on Dec. 20, 2007, which is incorporated by reference in its entirety.

BACKGROUND OF THE INVENTION

The present invention relates to a semiconductor memory device, and more particularly, to a semiconductor memory input/output device supporting a multi-operation mode.

In order to increase an operating speed of a semiconductor memory device, recent semiconductor technology continuously increases an operating frequency. Additionally, the number of data bits simultaneously inputted to or outputted from the semiconductor memory device increases. As a result, recent semiconductor memory devices include an increased number of pads for inputting and outputting data.

For example, a semiconductor memory device supporting an X8 operation mode includes eight data pads for inputting and outputting 8-bit data at the same time, two data strobe pads for a data strobe signal, a selection pad for a data mask signal or a read data strobe signal, and an inverted read data strobe pad for an inverted read data strobe signal.

Referring to FIG. 1, the conventional semiconductor memory device supporting an X8 operation mode includes a selection pad 1 and an inverted read data strobe pad 2. The selection pad 1 is controlled by a first setting signal RDQSEN that is generated by a set value of an extended mode register set EMRS. The selection pad 1 outputs a read data mask signal RDQS outputted from an output buffer 3 or transfers a data mask signal DM from an external device to an input buffer 4.

The inverted read data strobe pad 2 is controlled by a second setting signal RDQSbEN that is generated based on a set value of an extended mode register set EMRS and outputs an inverted read data mask signal RDQSb from an output buffer 5.

Here, the set value of the extended mode register set EMRS is decided based on an extended mode register set EMRS and address fields A11 and A10 when a semiconductor memory device operates in an X8 operation mode defined in DDR2 SDRAM specification.

According to the DDR2 SDRAM specification, if a value of the address field A11 that sets an extended mode register set is logic high, a read data strobe signal RDQS is used and a data mask signal is not used in the X8 operation mode. Accordingly, when the semiconductor memory device operates in the X8 operation mode, it is possible to share one pad for both of the lower data mask signal LDM and the read data strobe signal RDQS because the lower data mask signal LDM and the read data strobe signal RDQS are exclusively used in the X8 operation mode.

According to the DDR2 SDRAM specification, if a value of the address field A10 setting an extended mode register set EMRS is logic 'low', an inverted read data strobe signal RDQSB is used and an inverted data strobe signal DQSB is not used. Accordingly, the inverted read data pad outputs the inverted read data strobe signal RDQSB.

Meanwhile, the semiconductor memory device is designed to support a multi-operation mode for expanding generality. The multi-operation mode enables to select more than two of operation modes. For example, a semiconductor memory device is designed to enable a user to select one of an X16 operating mode and an X8 operation mode.

According to a related art, a semiconductor memory device supporting the X16 operation mode and the X8 operating mode includes 16 data pads and 4 data strobe pads.

When a semiconductor memory device operates in the X16 operation mode, the semiconductor memory device inputs or outputs 16-bit data through 8 upper data pads UDQ0 to UDQ7 and 8 lower data pads LDQ0 to LDQ7 and inputs or outputs upper and lower data strobe signals UDQS, UDQSb, LDQS and LDQSb through 2 upper data strobe pads and 2 lower data strobe pads that strobe upper and lower data inputted or outputted through the upper and lower data pads UDQ0 to UDQ7 and LDQ0 to LDQ7.

When a semiconductor memory device operates in the X8 operation mode, the semiconductor memory device inputs or outputs 8-bit data through 8 lower data pads LDQ0 to LDQ7 and inputs or outputs lower data strobe signals LDQS and LDQSb through two lower data strobe pads.

As shown in FIG. 2, the semiconductor memory device supporting the X16 operation mode or the X8 operation mode further includes a data mask pad, an inverted read data mask pad, and a selection pad.

In the X16 operation mode, the selection pad 21 and the data mask pad 23 transfer lower and upper data mask signals LDM and UDM to the input buffers 25 and 27. Here, the lower and upper data mask signals LDM and UDM are inputted for masking lower and upper data from an external device.

In the X8 operation mode, the selection pad 21 transfers a lower data mask signal LDM inputted from an external device by a first setting signal RDQSEN to an input buffer 25 or outputs a read data strobe signal RDQS outputted from the output buffer 24. The inverted read data strobe pad 22 outputs the inverted read data strobe signal RDQSb which is selectively outputted from the output buffer 26 by the second setting signal RDQSbEN that is controlled by a set value of an extended mode register set EMRS.

As described above, the conventional semiconductor memory device supporting a multi-operation mode includes an upper data mask pad for the X16 operation mode, which is not used for the X8 operation mode and also includes the inverted read data strobe pad for the X8 operation mode, which is not used for the X16 operation mode.

As a result, an overall size of a semiconductor memory device increases because the semiconductor memory device includes more pads for supporting the multi-operation mode. Since lines and pads must not be overlapped, it becomes very difficult to dispose lines in a semiconductor memory device if the number of pads increases. The operation characteristics of the semiconductor memory device are deteriorated.

SUMMARY OF THE INVENTION

Embodiments of the present invention are directed to providing a semiconductor memory input/output device for reducing an overall size of a semiconductor memory device by reducing the number of pads in the semiconductor memory device supporting a multi-operation mode.

Embodiments of the present invention are also directed to providing a semiconductor memory device for improving operation characteristics by reducing limitation of disposing lines.

In accordance with an aspect of the present invention, there is provided a semiconductor memory input/output device including first and second selection pads used to input and output signals for a plurality of operation modes and having multiple functions corresponding to a selected operation mode, a control signal generator for outputting first and second setting signals and a mask control signal by an extended mode register set signal having information about the multiple functions and an operation mode signal having information on the plurality of operation modes, a lower input/output unit including a lower output buffer for outputting a read data strobe signal to the first selection pad and a lower input buffer for receiving a lower data mask signal from the selection pad, and selecting one operation of the lower output buffer and the lower input buffer by the first setting signal, and an upper input/output unit including an upper output buffer for outputting an inverted read data strobe signal to the second selection pad and an upper input buffer for receiving an upper data mask signal from the second selection pad, and selecting one operation of the upper output buffer and the upper input buffer by the second setting signal and the mask control signal.

The control signal generator may include a mode register controller for outputting the first and second setting information based on the extended mode register set signal and an address field, and a mask controller for outputting the mask control signal by the second setting information and the operation mode signal.

The mode register controller may receive the address fields A0 to A12 and outputs the first setting signal that decides whether one of the read data strobe signal and the lower data mask signal is used or not by an address field A11 among the received address fields A0 to A12.

The mode register controller may output the second setting signal that decides whether the inverted read data strobe signal is used or not by the mode register address field A10.

The mask controller may output the mask control signal that selects the operation of the upper input buffer when the second setting signal is disabled and the operation mode signal is enabled.

The operation mode signal may be a signal corresponding to an operation mode that inputs and outputs 16-bit data at the same time.

In the lower input/output unit, the lower output buffer may output the read data strobe signal synchronized with a rising edge of a DLL clock by an output enable signal to the first selection pad when the first setting signal is enabled, and the lower input buffer may receive the lower data mask signal from the first selection pad by an input enable signal when the first setting signal is disabled.

In the upper input/output unit, the upper output buffer may output the inverted read data strobe signal synchronized at a falling edge of the DLL clock to the second selection pad by the output enable signal when the second signal is enabled, and the upper input unit may receive the upper data mask signal by the input enable signal when the mask control signal is enabled.

In accordance with an aspect of the present invention, there is provided a semiconductor memory device including a selection pad having multiple functions corresponding to an operation mode, an input/output controller for outputting a setting signal and a mask control signal by an extended mode register signal having information on the multiple functions and an operation mode signal having information on the multiple operation modes, an output buffer for outputting a read data strobe signal synchronized with a DLL clock to the selection pad by the setting signal when an output enable signal is enabled, and an input buffer for receiving a data mask signal from the selection pad by the mask control signal when an input enable signal is enabled.

The input/output controller may include a mode register controller for the setting signal by the extended mode register set signal and an address field, and a mask controller for outputting the mask control signal by the setting signal and the operation mode signal.

The mode register controller may receive the address fields A0 to A12, and outputting the setting signal that decides whether the inverted read data strobe signal is used or not by an address field A10 among the received address fields A0 to A12.

The mask controller may output the mask control signal that operates the input buffer when the setting signal is disabled and the operation mode signal is enabled.

The operation mode signal may be a signal corresponding to an operation mode for inputting and outputting 16-bit data at the same time.

BRIEF DESCRIPTION OF THE DRAWINGS

FIG. 3 is a diagram illustrating extended mode register set information defined in DDR2 SDRAM specification.

DESCRIPTION OF SPECIFIC EMBODIMENTS

Figure 1:
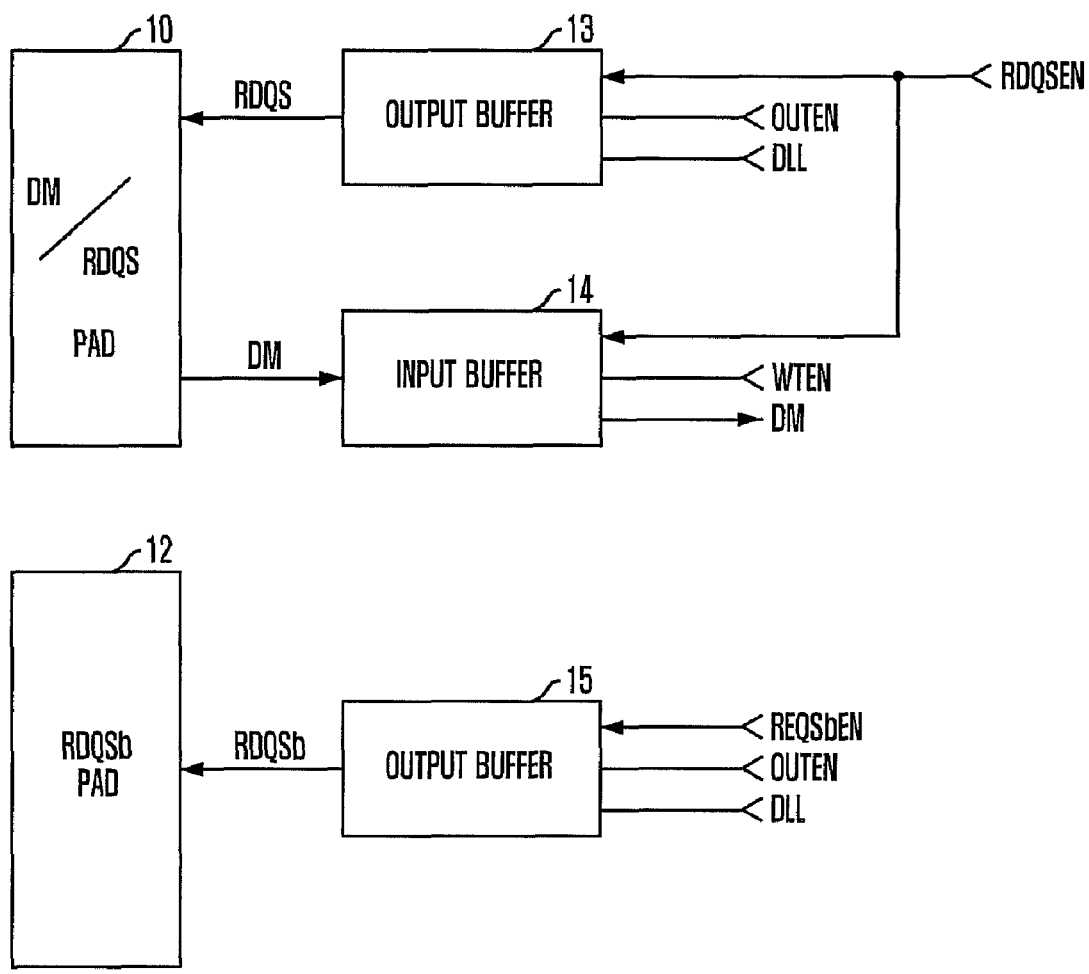
FIG. 1 is a block diagram illustrating an input/output device including pads of a conventional semiconductor memory device operating in an X8 operation mode.
Figure 2:
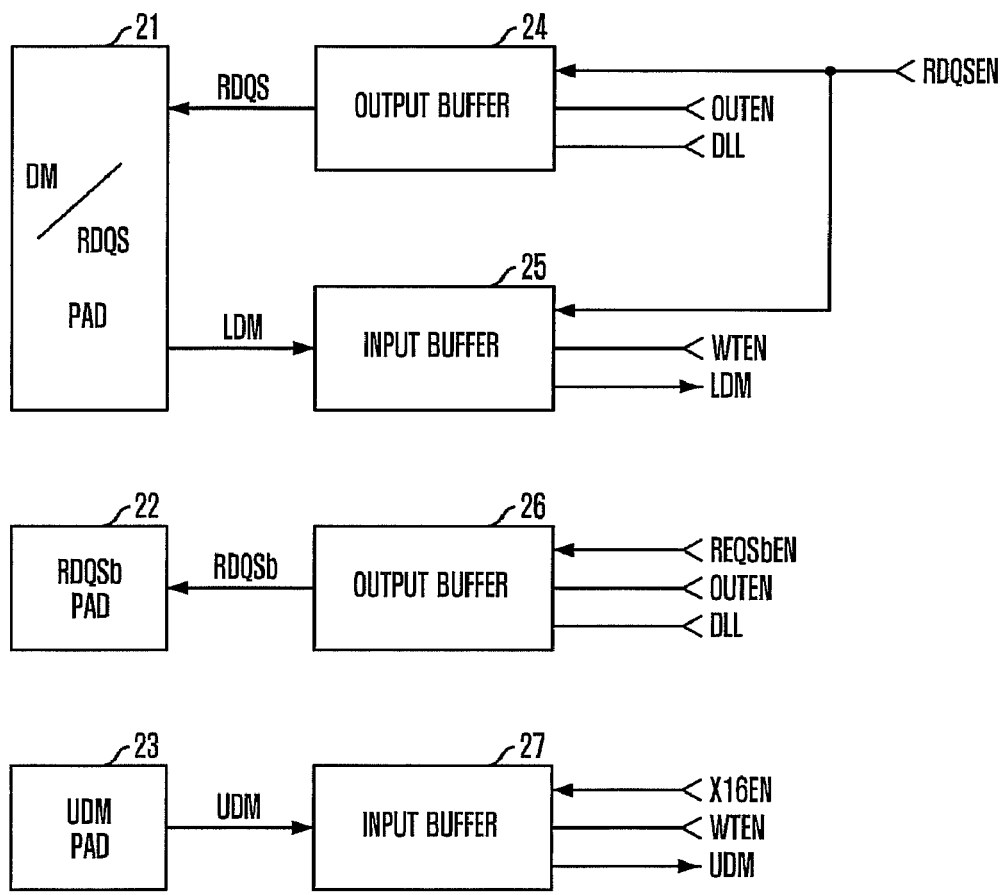
FIG. 2 is a block diagram illustrating an input/output device including pads of a conventional semiconductor memory device supporting a multi operation mode.

Other objects and advantages of the present invention can be understood by the following description, and become apparent with reference to the embodiments of the present invention.

The present invention relates to a semiconductor memory input/output device for reducing the number of pads in a semiconductor memory device supporting a multi-operation mode by sharing pads for signals that are independently used in each of operation modes.

The present invention relates to sharing pads for a read data strobe signal RDQS and a data mask signal DM by setting an extended mode register set when a semiconductor memory device operates in an X8 operation mode defined in the DDR2 SDRAM specification.

That is, the number of pads in a semiconductor memory device supporting a multi-operation mode is reduced by sharing one pad for both of an inverted read data strobe signal RDQSb of the X8 operation mode and an upper data mask signal UDM for the X16 operation mode.

According to the DDR2 SDRAM specification shown in FIG. 3, if the value of an address field A11 setting an extended mode register set EMPS is logic high in the X8 operation mode, the read data strobe signal RDQS is used, and the data mask signal DM is not used. On the contrary, if the value of the address field A11 is logic low, the data mask signal DM is used, and the read data strobe signal RDQS is not used.

If a value of the address field A10 is logic low, the inverted data strobe signal DQSb is used. Accordingly, the inverted read data strobe signal RDQSb is used. On the contrary, a value of the address field A10 is logic high, it prohibits using the inverted data strobe signal DQSb. Also, the inverted read data strobe signal RDQSb is not used.

The semiconductor memory device supporting an X16 operation mode and an X8 operation mode according to the present embodiment includes 16 data pads, 4 data strobe pads and 2 selection pads.

Here, the number of data pads and strobe pads are identical to those of the related art. On the contrary, the semiconductor memory device according to the present embodiment includes two selection pads as one data mask pad, one inverted read data mask pad and one selection pad according to the related art.

To be specific, the 16 data pads are divided into 8 upper data pads UDQ0 to UDQ7 and 8 lower data pads LDQ0 to LDQ7, the 4 data strobe pads are divided into 2 upper data strobe pads and 2 lower data strobe pads. The 2 selection pads are divided into an upper selection pad and a lower selection pad and are selected as an input pad and an output pad based on a set value of an extended mode register set EMRS and an operation mode signal.

When the semiconductor memory device according to the present embodiment operates in the X16 operation mode, the semiconductor memory device according to the present embodiment inputs and output 16-bit data through the 8 upper data pads and 8 lower data pads UDQ0 to QDQ7 and LDQ0 to LDQ7 and inputs and outputs upper and lower data strobe signals UDQS, UDQSb, LDQS, and LDQSb through the four upper data strobe pads and the four lower data strobe pads. The semiconductor memory device according to the present embodiment receives upper and lower data mask signals UDM and LDM through the two upper selection pads and two lower selection pads.

When the semiconductor memory device according to the present embodiment operates in the X8 operation mode, the semiconductor memory device according to the present embodiment inputs and outputs 8-bit data through the lower data pads LDQ0 to LDQ7 and inputs and outputs lower data strobe signals LDQS and LDQSb through two lower data strobe pads. In addition, the semiconductor memory device according to the present embodiment receives a lower data mask signal LDM through a lower selection pad by a set value of an extended mode register set or outputs a read data strobe signal RDQS and an inverted read data strobe signal RDQSb through the upper and lower selection pads.

Figure 4:
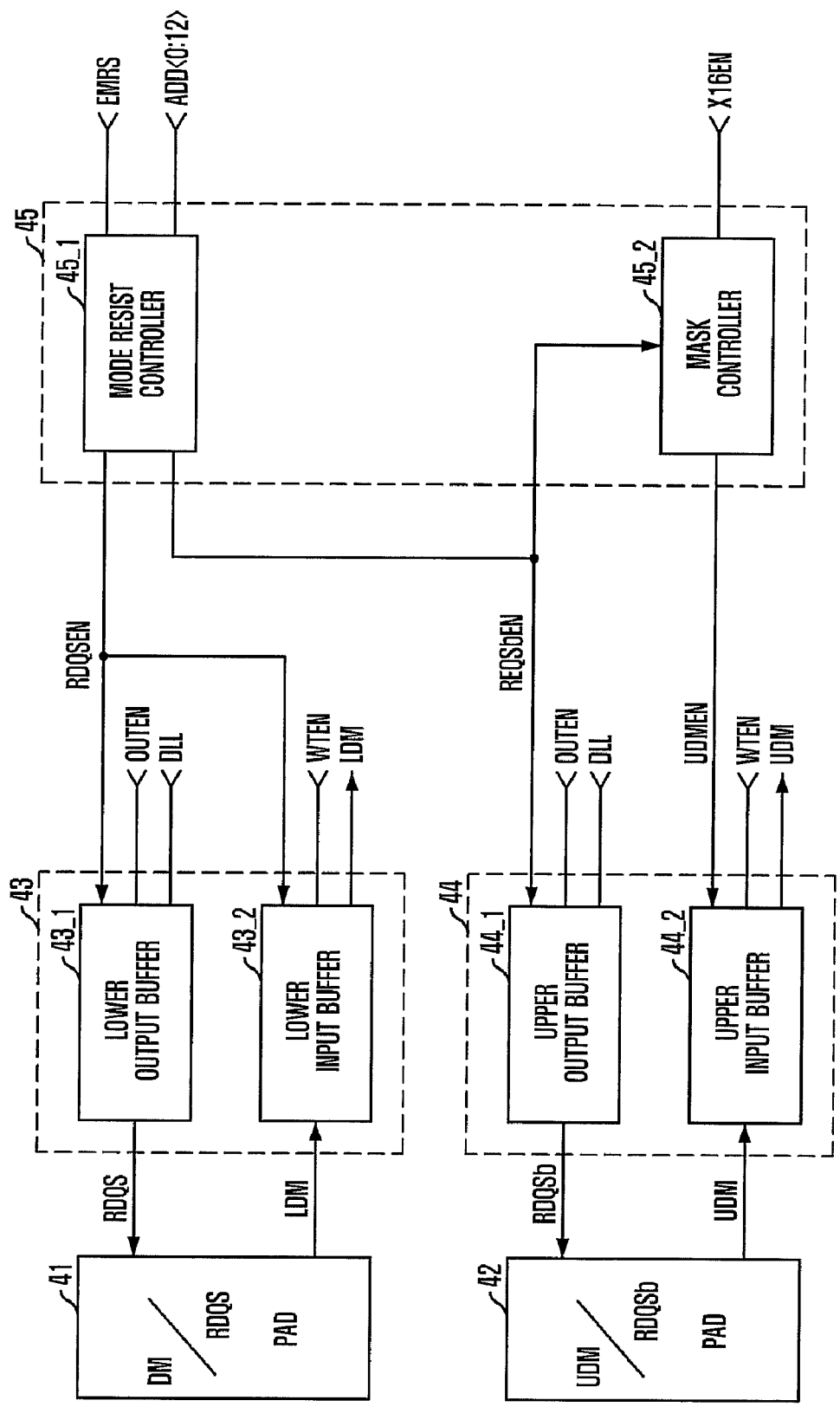
FIG. 4 is a block diagram illustrating an input/output device including pads of a semiconductor memory device supporting a multi-operation mode in accordance with an embodiment of the present invention.

FIG. 4 is a block diagram illustrating a semiconductor memory input/output device having upper and lower selection pads in accordance with an embodiment of the present invention.

Referring to FIG. 4, the semiconductor memory input/output device according to the present embodiment includes lower and upper selection pads 10 and 12, a control signal generator 20 for outputting first and second setting signals RDQSEN and RDWSbEN and a mask control signal UDMEN, a lower input/output unit 30 for selecting an input/output path of a lower selection pad, and an upper input/output unit 40 for selecting an input/output path of the upper selection pad.

The control signal generator 20 includes a mode register controller 22 for outputting first and second setting signals RDQSEN and RDQSbEN by an address ADD<0:12> inputted for setting an extended mode register set EMRS and a mask controller 24 for outputting a mask control signal UDMEN by the second setting signal RDQSbEN and an operation mode signal X16EN.

To be specific, the mode register controller 22 enables a first setting signal RDQSEN and outputs the enabled first setting signal if an address field A11 is logic high among addresses <0:12> inputted for setting an extended mode register set EMRS. The mode register controller 22 enables and outputs a second setting signal RDQSbEN if the address field A10 is logic low. The first setting signal RDQSEN selects an input/output path of the lower selection pad 10 as a signal for deciding whether to use a read data strobe signal RDQS or not. The second setting signal RDQSbEN controls an output path of the upper selection pad 12 as a signal that decides whether to use an inverted read data strobe signal RDQSb or not.

The mask controller 24 enables and outputs a mask control signal UDMEN when the second setting signal RDQSbEN is disabled and the operation mode signal X16EN is enabled. The mask control signal UDMEN controls an input path of the upper selection pad 12.

The lower input/output unit 30 includes a lower output buffer 32 and a lower input buffer 34.

The lower output buffer 32 selects an output path of a lower selection pad 10 when the first setting signal RDQSEN is enabled and outputs a read data strobe signal RDQS that is synchronized with a DLL clock DLL by an output enable signal OUTEN.

The lower input buffer 34 selects an input path of the lower selection pad 10 when the first setting signal RDQSEN is disabled, receives a lower data mask signal LDM from the lower selection pad 10 by an input enable signal WTEN, buffers and outputs the received lower data mask signal LDM.

The upper input/output unit 40 includes an upper output buffer 42 and an upper input buffer 44.

The upper output buffer 42 selects an output path of the upper selection pad 12 and outputs an inverted read data strobe signal RDQSb synchronized with a DLL clock DLL by an output enable signal OUTEN when a second setting signal RDQSbEN is enabled.

The upper input buffer 44 selects an input path of the upper selection pad 12 when the mask control signal UDMEN is enabled, receives an upper data mask signal UDM from the upper selection pad 12 by the input enable signal WTEN, and buffers and outputs the received upper data mask signal UDM.

As described above, the semiconductor memory input/output device supporting a multi-operation mode according to the present embodiment shares one pad, that is, the upper selection pad 12 instead of using a pad allocated for an inverted read data strobe signal independently in the X8 operation mode and a pad allocated for an upper data mask signal UDM independently in the X16 operation mode. Therefore, the number of pads can be reduced.

As a result, the overall size of the semiconductor memory device can be reduced, and the operation characteristics of the semiconductor memory device can be improved by reducing the limitation of disposing lines not to be overlapped with the pads.

While the present invention has been described with respect to the specific embodiments, it will be apparent to those skilled in the art that various changes and modifications may be made without departing from the spirit and scope of the invention as defined in the following claims.

Embodiments of the present invention relate to a semiconductor memory input/output device for reducing the number of pads in a semiconductor memory device supporting a multi-operation mode by sharing a pad for signals independently used in each of operation modes. Therefore, the overall size of the semiconductor memory input/output device can be reduced.

Since the semiconductor memory input/output device includes the less number of pads than that of the related art, the limitation of disposing lines not to be overlapped with the pads can be reduced. Therefore, the operation characteristics of the semiconductor memory device can be improved.

What is claimed is:

1. A semiconductor memory input/output device, comprising:
   first and second selection pads used to input and output signals for a plurality of operation modes and having multiple functions corresponding to a selected operation mode;
   a control signal generator for outputting first and second setting signals and a mask control signal by an extended mode register set signal having information about the multiple functions and an operation mode signal having information on the plurality of operation modes;
   a lower input/output unit including a lower output buffer for outputting a read data strobe signal to the first selection pad and a lower input buffer for receiving a lower data mask signal from the selection pad, and selecting one operation of the lower output buffer and the lower input buffer by the first setting signal; and
   an upper input/output unit including an upper output buffer for outputting an inverted read data strobe signal to the second selection pad and an upper input buffer for receiving an upper data mask signal from the second selection pad, and selecting one operation of the upper output buffer and the upper input buffer by the second setting signal and the mask control signal.

2. The semiconductor memory input/output device of claim 1, wherein the control signal generator includes:
   a mode register controller for outputting the first and second setting information based on the extended mode register set signal and an address field; and
   a mask controller for outputting the mask control signal by the second setting information and the operation mode signal.

3. The semiconductor memory input/output device of claim 2, wherein the mode register controller receives the address fields A0 to A12 and outputs the first setting signal that decides whether one of the read data strobe signal and the lower data mask signal is used or not by an address field A11 among the received address fields A0 to A12.

4. The semiconductor memory input/output device of claim 3, wherein the mode register controller outputs the second setting signal that determines whether the read data strobe signal inverted by the mode register address field A10 is used or not.

5. The semiconductor memory input/output device of claim 2, wherein the mask controller outputs the mask control signal that selects the operation of the upper input buffer when the second setting signal is disabled and the operation mode signal is enabled.

6. The semiconductor memory input/output device of claim 5, wherein the operation mode signal is a signal corresponding to an operation mode that inputs and outputs 16-bit data at the same time.

7. The semiconductor memory input/output device of claim 1, wherein the lower output buffer of the lower input/output unit outputs the read data strobe signal synchronized with a rising edge of a DLL clock in response to an output enable signal to the first selection pad when the first setting signal is enabled, and receives the lower data mask signal from the first selection pad by an input enable signal when the first setting signal is disabled.

8. The semiconductor memory input/output device of claim 7, wherein the upper output buffer of the upper input/output unit outputs the inverted read data strobe signal synchronized at a falling edge of the DLL clock to the second selection pad in response to the output enable signal when the second signal is enabled, and receives the upper data mask signal by the input enable signal when the mask control signal is enabled.

9. A semiconductor memory device, comprising:
   a selection pad having multiple functions corresponding to an operation mode;
   an input/output controller for outputting a setting signal and a mask control signal by an extended mode register signal having information on the multiple functions and an operation mode signal having information on the multiple operation modes;
   an output buffer for outputting a read data strobe signal synchronized with a DLL clock to the selection pad by the setting signal when an output enable signal is enabled; and
   an input buffer for receiving a data mask signal from the selection pad by the mask control signal when an input enable signal is enabled.

10. The semiconductor memory device of claim 9, wherein the input/output controller includes a mode register controller for outputting the setting signal by the extended mode register set signal and an address field; and
   a mask controller for outputting the mask control signal by the setting signal and the operation mode signal.

11. The semiconductor memory device of claim 10, wherein the mode register controller for receiving the address fields A0 to A12, and outputting the setting signal that decides whether the inverted read data strobe signal is used or not by an address field A10 among the received address fields A0 to A12.

12. The semiconductor memory device of claim 10, wherein the mask controller outputs the mask control signal that operates the input buffer when the setting signal is disabled and the operation mode signal is enabled.

13. The semiconductor memory device of claim 12, wherein the operation mode signal is a signal corresponding to an operation mode for inputting and outputting 16-bit data at the same time.

* * * * *